(12) United States Patent
Miyashita (10) Patent No.: US 8,446,302 B2
(45) Date of Patent: May 21, 2013

(54) TIME TO DIGITAL CONVERTER AND ALL DIGITAL PHASE-LOCKED-LOOP

(75) Inventor: Daisuke Miyashita, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 106 days.

(21) Appl. No.: 13/052,303

(22) Filed: Mar. 21, 2011

(65) Prior Publication Data

US 2012/0062296 A1 Mar. 15, 2012

(30) Foreign Application Priority Data

Sep. 9, 2010 (JP) ................................. 2010-201873

(51) Int. Cl.
*H03M 1/48* (2006.01)
(52) U.S. Cl.
USPC ........................................... 341/111; 341/155
(58) Field of Classification Search
USPC .............. 341/155, 144, 143, 110, 111; 327/7, 327/159
See application file for complete search history.

(56) References Cited

U.S. PATENT DOCUMENTS

| | | | |
|---|---|---|---|
| 7,564,284 B2 | 7/2009 | Henzler et al. | |
| 7,888,973 B1 * | 2/2011 | Rezzi et al. | 327/105 |
| 7,936,229 B2 * | 5/2011 | Akhtar et al. | 332/145 |
| 8,248,104 B2 * | 8/2012 | Maeda | 327/7 |
| 2010/0141314 A1 * | 6/2010 | Chen | 327/159 |

FOREIGN PATENT DOCUMENTS

| | | |
|---|---|---|
| JP | 61-227422 | 10/1986 |
| JP | 2002-076886 | 3/2002 |
| JP | 2002-190724 | 7/2002 |
| JP | 2003-091331 | 3/2003 |
| JP | 2006-217563 | 8/2006 |
| JP | 2007-110370 | 4/2007 |
| JP | 2009-152682 | 7/2009 |
| JP | 2010-074201 | 4/2010 |
| JP | 2010-109716 | 5/2010 |
| WO | 2009034881 | 3/2009 |

OTHER PUBLICATIONS

Japanese Office Action for Japanese Application No. 2010-201873 mailed on Dec. 18, 2012.

* cited by examiner

*Primary Examiner* — Peguy Jean Pierre
(74) *Attorney, Agent, or Firm* — Turocy & Watson, LLP (57) ABSTRACT

According to one embodiment, a multiphase circuit, a flip-flop, and a decoder are provided. The multiphase circuit generates multiphase signals of which phases are different from each other by 180/M degrees by dividing a differential oscillation signal by M (M is an integral number not smaller than 2). The flip-flop captures the multiphase signal in synchronization with an input of a reference signal. The decoder decodes an output signal of the flip-flop.

17 Claims, 12 Drawing Sheets

TIME TO DIGITAL CONVERTER AND ALL DIGITAL PHASE-LOCKED-LOOP

CROSS-REFERENCE TO RELATED APPLICATIONS

This application is based upon and claims the benefit of priority from the prior Japanese Patent Application No. 2010-201873, filed on Sep. 9, 2010; the entire contents of which are incorporated herein by reference.

FIELD

Embodiments described herein relate generally to a time to digital converter and an all digital phase-locked-loop.

BACKGROUND

Since an all digital phase-locked-loop (ADPLL) may be formed by a CMOS process, a chip size may be made smaller with development in miniaturization and high performance and low-voltage operation may be realized.

In the all digital phase-locked-loop, a time to digital converter (TDC) is used for detecting phase shift between an output signal of an oscillator and a reference signal.

In a conventional time to digital converter, the phase shift between the output signal of the oscillator and the reference signal is calculated using delay time of a delay element as a unit. Therefore, in the conventional time to digital converter, temporal resolution thereof is limited by the delay time of the delay element of one stage and a normalization process to calculate the delay time of the delay element of one stage based on a cycle of the oscillator is necessary.

DETAILED DESCRIPTION

In general, according to embodiments, a multiphase circuit, flip-flops, and a decoder are provided. The multiphase circuit generates multiphase signals of which phases are different from each other by 180/M degrees by dividing a differential oscillation signal by M (M is an integral number not smaller than 2). Each of the flip-flops captures each of the multiphase signals in synchronization with an input of a reference signal. The decoder decodes an output signal of the flip-flop.

Hereinafter, a time to digital converter according to the embodiments is described with reference to the drawings. Meanwhile, the present invention is not limited by the embodiments.

(First Embodiment)

Figure 1:
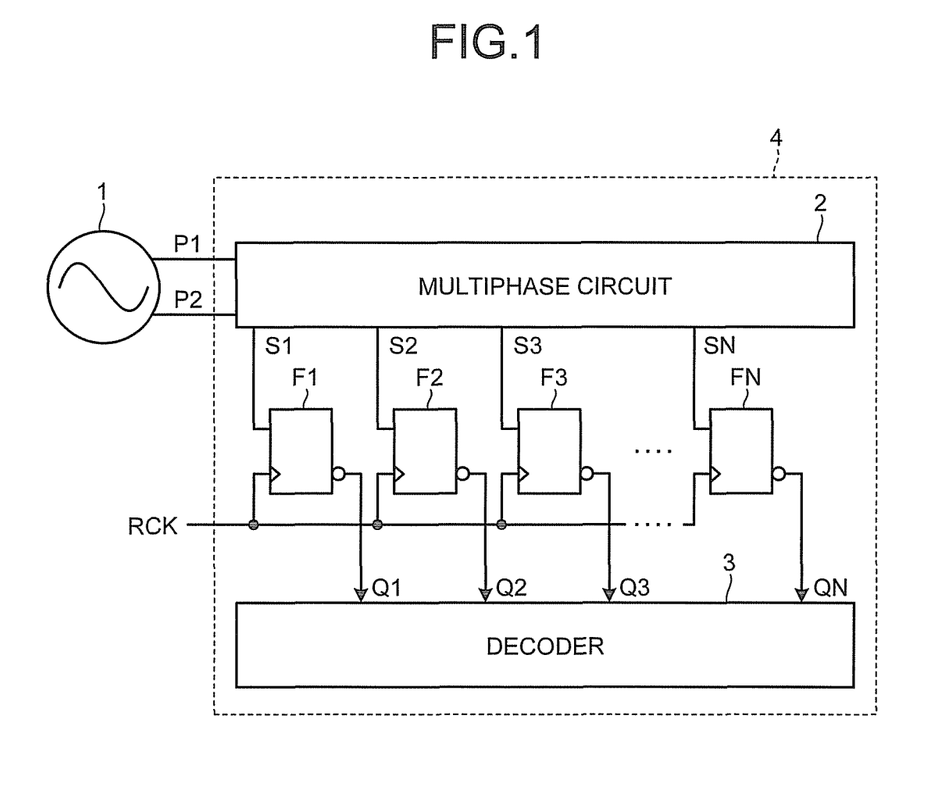
FIG. 1 is a block diagram of a schematic configuration of a time to digital converter according to a first embodiment.

FIG. 1 is a block diagram of a schematic configuration of the time to digital converter according to a first embodiment.

In FIG. 1, a time to digital converter 4 is provided with a multiphase circuit 2, N(N is an integral number not smaller than 2) flip-flops F1 to FN, and a decoder 3. The time to digital converter 4 is connected to a differential oscillator 1.

Differential oscillation signals P1 and P2 are generated by the differential oscillator 1 to be output to the multiphase circuit 2. In the multiphase circuit 2, the differential oscillation signals P1 and P2 are divided by M (M is an integral number not smaller than 2), and according to this, multiphase signals S1 to SN of which phases are different from each other by 180/M degrees are generated to be output to the flip-flops F1 to FN, respectively. In the flip-flops F1 to FN, the multiphase signals S1 to SN are captured in synchronization with a rising edge of a reference signal RCK, and according to this, output signals Q1 to QN are output to the decoder 3. In the decoder 3, the output signals Q1 to QN of the flip-flops F1 to FN are decoded, and according to this, a digital code is generated. Meanwhile, the decoder 3 may convert the output signals Q1 to QN output as Johnson data to binary data.

Herein, by generating the multiphase signals S1 to SN by dividing the differential oscillation signals P1 and P2 by M, it becomes possible to detect phase shift between the multiphase signals S1 to SN and the reference signal RCK based on cycles of the differential oscillation signals P1 and P2. Therefore, temporal resolution of the phase shift of the signals is not limited by delay time of a delay element, so that it becomes possible to improve the temporal resolution, and a normalization process to calculate rising times of the multiphase signals S1 to SN based on the cycles of the differential oscillation signals P1 and P2 becomes not necessary.

(Second Embodiment)

Figure 2A:
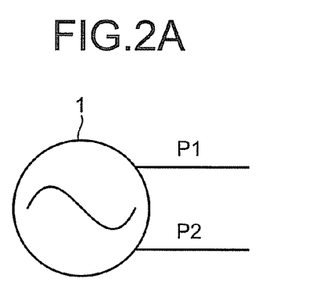
FIG. 2A is a block diagram of a schematic configuration of a multiphase circuit applied to the time to digital converter according to a second embodiment.
Figure 2B:
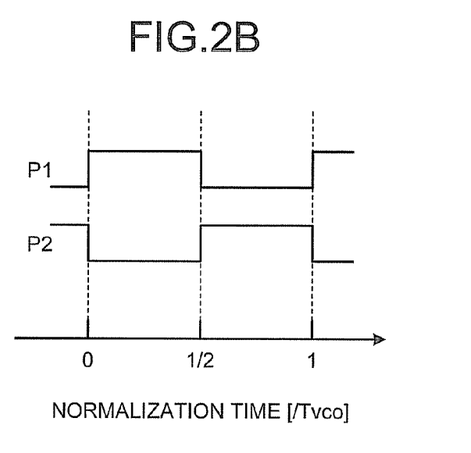
FIG. 2B is a timing chart of an output waveform of a differential oscillator 1 in FIG. 2A.

FIG. 2A is a block diagram of a schematic configuration of the multiphase circuit applied to the time to digital converter according to a second embodiment, and FIG. 2B is a timing chart of an output waveform of the differential oscillator 1 in FIG. 2A. Meanwhile, in FIG. 2B, the cycles of the differential oscillation signals P1 and P2 are represented by values normalized by a cycle Tvco of the reference signal RCK.

Meanwhile, in the second embodiment, the differential oscillation signals P1 and P2 are used as the multiphase signals S1 and S2 of the multiphase circuit 2 in FIG. 1.

In FIGS. 2A and 2B, in the differential oscillator 1, the differential oscillation signals P1 and P2 of which phases are different from each other by 180 degrees are generated. Therefore, the differential oscillation signals P1 and P2 may be used as the multiphase signals S1 and S2 having the rising edges at 0 [/Tvco] and 1/2 [/Tvco], respectively.

The multiphase signals S1 and S2 are based on the cycles of the differential oscillation signals P1 and P2, so that the normalization process to calculate the rising times of the multiphase signals S1 and S2 based on the cycles of the differential oscillation signals P1 and P2 becomes not necessary.

(Third Embodiment)

Figure 3A:
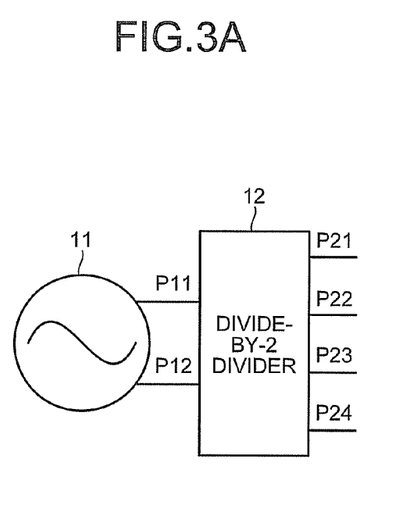
FIG. 3A is a block diagram of a schematic configuration of the multiphase circuit applied to the time to digital converter according to a third embodiment.
Figure 3B:
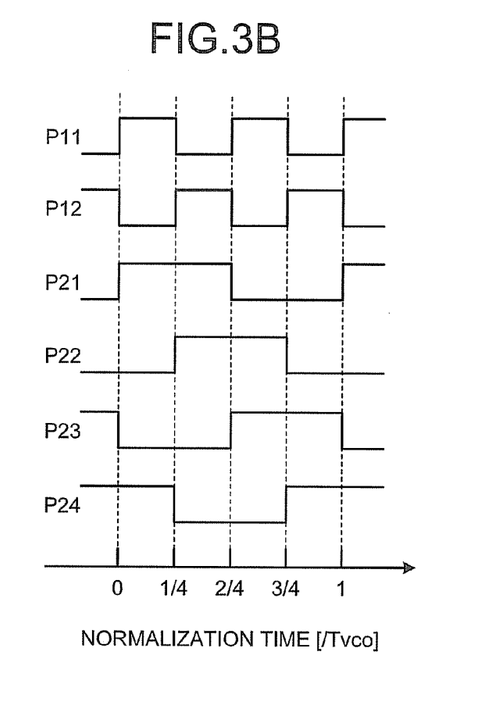
FIG. 3B is a timing chart of an output waveform of the multiphase circuit in FIG. 3A.

FIG. 3A is a block diagram of a schematic configuration of the multiphase circuit applied to the time to digital converter according to a third embodiment, and FIG. 3B is a timing chart of an output waveform of the multiphase circuit in FIG. 3A. Meanwhile, in the third embodiment, a differential oscillator 11 is used in place of the differential oscillator 1 in FIG. 1 and a divide-by-2 divider 1 is used as the multiphase circuit 2 in FIG. 1.

In FIG. 3A, an oscillation frequency of the differential oscillator 11 is set to twice the oscillation frequency of the differential oscillator 1. Therefore, in the differential oscillator 11, differential oscillation signals P11 and P12 of which frequencies are twice the frequencies of the differential oscillation signals P1 and P2, respectively, are generated. Then, the differential oscillation signals P11 and P12 are input to the divide-by-2 divider 12.

Then, in the divide-by-2 divider 12, multiphase signals P21 to P24 of which cycles are half the cycles of the differential oscillation signals P11 and P12 and of which phases are different from one another by 90 degrees are generated. Herein, phase difference of 90 degrees between each of the multiphase signals P21 to P24 corresponds to 1/4 [/Tvco], so that the multiphase signals P21 to P24 may have the rising edges at 0 [/Tvco], 1/4 [/Tvco], 2/4 [Tvco], and 3/4 [Tvco], respectively.

The multiphase signals P21 to P24 are based on the cycles of the differential oscillation signals P11 and P12, so that the normalization process to calculate the rising times of the multiphase signals P21 and P24 based on the cycles of the differential oscillation signals P11 and P12 becomes not necessary. Also, in a configuration in FIG. 3, the temporal resolution may be improved twice as much as that of the configuration in FIG. 2.

Figure 4:
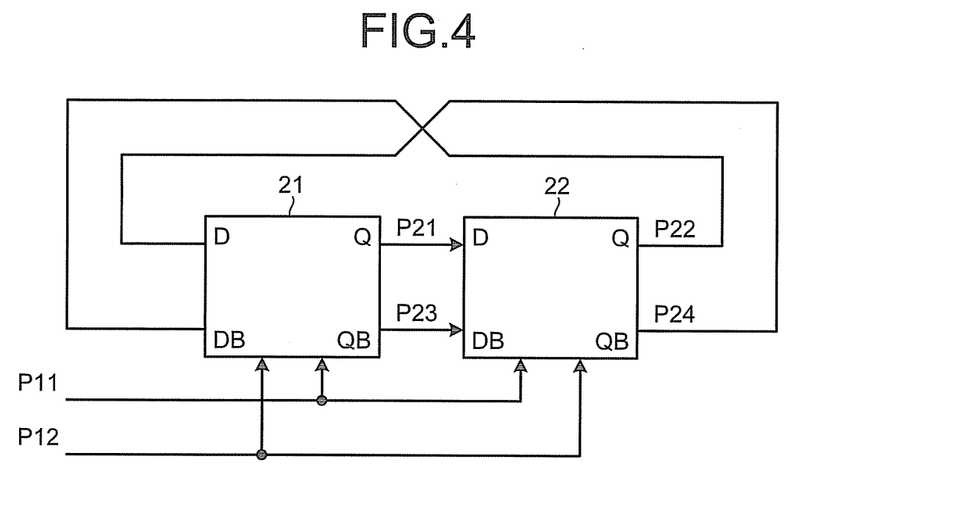
FIG. 4 is a block diagram of a configuration example of a divide-by-2 divider 12 in FIG. 3.

FIG. 4 is a block diagram of a configuration example of the divide-by-2 divider 12 in FIG. 3.

In FIG. 4, the divide-by-2 divider 12 is provided with latch circuits 21 and 22. Herein, a non-inverted output Q of the latch circuit 21 is input to a non-inverted input D of the latch circuit 22, and an inverted output QB of the latch circuit 21 is input to an inverted input DB of the latch circuit 22. On the other hand, a non-inverted output Q of the latch circuit 22 is input to an inverted input DB of the latch circuit 21 and an inverted output QB of the latch circuit 22 is input to a non-inverted input D of the latch circuit 21.

Then, the outputs of the latch circuit 21 are captured by the latch circuit 22 in synchronization with the rising edges of the differential oscillation signals P11 and P12 and the outputs of the latch circuit 22 are captured by the latch circuit 21, and according to this, the multiphase signals P21 and P23 are output from the latch circuit 21 and the multiphase signals P22 and P24 are output from the latch circuit 22.

Figure 5:
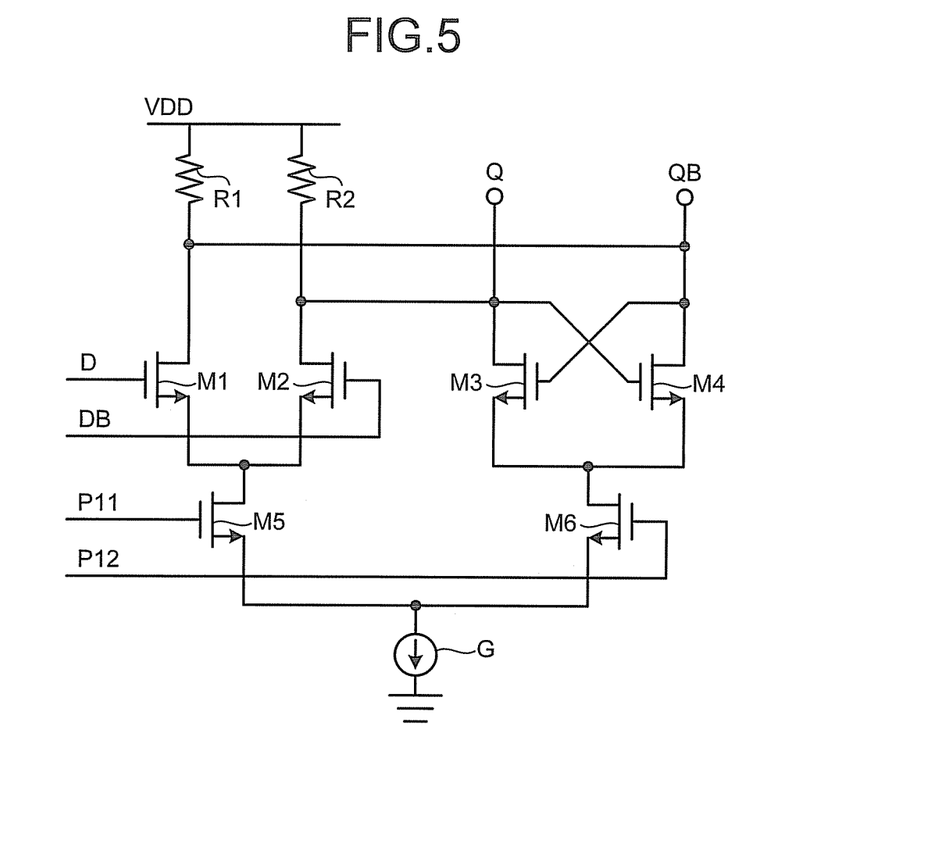
FIG. 5 is a circuit diagram of a configuration example of a latch circuit 21 in FIG. 4.

FIG. 5 is a circuit diagram of a configuration example of the latch circuit 21 in FIG. 4. Meanwhile, the latch circuit 22 may also be configured as the latch circuit 21.

In FIG. 5, the latch circuit 21 is provided with resistors R1 and R2, field effect transistors M1 to M6, and a current source G. A drain of the field effect transistor M1 is connected to supply potential VDD through the resistance R1 and a drain of the field effect transistor M2 is connected to the supply potential VDD through the resistance R2. Sources of the field effect transistors M1 and M2 are connected to a drain of the field effect transistor M5.

A drain of the field effect transistor M3 is connected to the drain of the field effect transistor M2 and a gate of the field effect transistor M4, and a drain of the field effect transistor M4 is connected to the drain of the field effect transistor M1 and a gate of the field effect transistor M3. Sources of the field effect transistors M3 and M4 are connected to a drain of the field effect transistor M6. Sources of the field effect transistors M5 and M6 are grounded through the current source G.

Then, the non-inverted input D is input to a gate of the field effect transistor M1 and non-inverted input DB is input to a gate of the field effect transistor M2. The differential oscillation signal P11 is input to a gate of the field effect transistor M5 and the differential oscillation signal P12 is input to a gate of the field effect transistor M6. Also, the inverted output Q is output from the drain of the field effect transistor M3 and the non-inverted output QB is output from the drain of the field effect transistor M4.

When the differential oscillation signal P11 rises, either the field effect transistor M1 or M2 is turned on according to levels of the inverted input DB and the non-inverted input D. Next, when the differential oscillation signal P12 rises, either the field effect transistor M3 or M4 is turned on according to on-states of the field effect transistors M1 and M2 and this state is held by the field effect transistors M3 and M4, and according to this, the inverted output Q and the non-inverted output QB are output.

(Fourth Embodiment)

Figure 6:
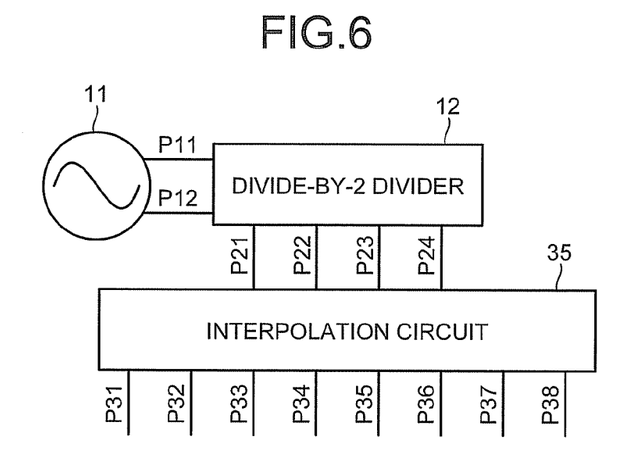
FIG. 6 is a block diagram of a schematic configuration of the multiphase circuit applied to the time to digital converter according to a fourth embodiment.

FIG. 6 is a block diagram of a schematic configuration of the time to digital converter according to a fourth embodiment. Meanwhile, in the fourth embodiment, the differential oscillator 11 is used in place of the differential oscillator 1 in FIG. 1 and the divide-by-2 divider 12 and an interpolation circuit 35 are used as the multiphase circuit 2 in FIG. 1.

In FIG. 6, in the interpolation circuit 35, an interval between the phases of the multiphase signals P21 to P24 of which phases are different from one another by 90 degrees is interpolated at regular intervals, and according to this, multiphase signals P31 to P38 of which phases are different from one another by 45 degrees are generated. In this interpolation, a new rising edge is generated between each of the rising edges of the multiphase signals P21 to P24. This interpolation may be realized by synthesizing a plurality of inverter outputs driven by the multiphase signals of which phases are different from each other. In a configuration in FIG. 6, the temporal resolution may be improved four times as much as that of the configuration in FIG. 2.

Figure 7A:
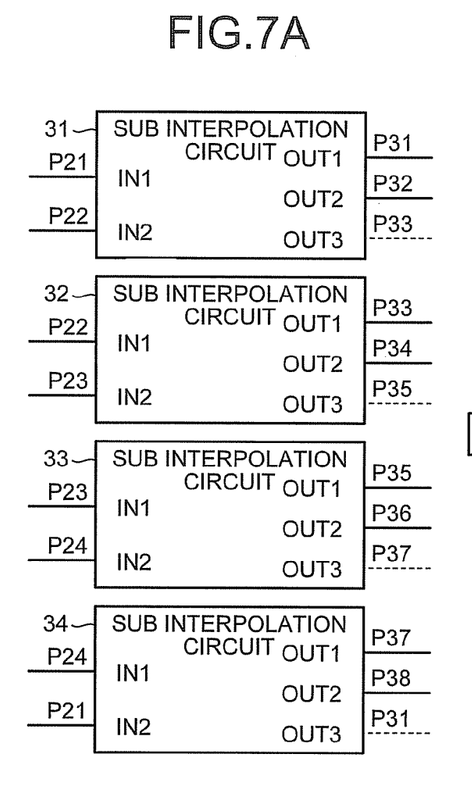
FIGS. 7A and 7B are block diagrams of a method of configuring an interpolation circuit 35 in FIG. 6.
Figure 7B:
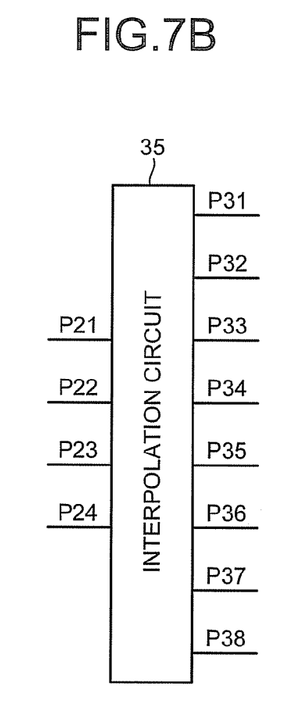

FIGS. 7A and 7B are block diagrams of a method of configuring the interpolation circuit 35 in FIG. 6.

In FIG. 7, a 4-input-8-output interpolation circuit 35 may be configured using four 2-input-3-output sub interpolation circuits 31 to 34. Herein, the multiphase signals P21 and P22 are input to the sub interpolation circuit 31 and the multiphase signals P31 to P33 are generated. The multiphase signals P22 and P23 are input to the sub interpolation circuit 32 and the multiphase signals P33 to P35 are generated. The multiphase signals P23 and P24 are input to the sub interpolation circuit 33 and the multiphase signals P35 to P37 are generated. The multiphase signals P24 and P21 are input to the sub interpolation circuit 34 and the multiphase signals P37, P38 and P31 are generated.

Meanwhile, the multiphase signal P33 is redundantly generated by the sub interpolation circuits 31 and 32, the multiphase signal P35 is redundantly generated by the sub interpolation circuits 32 and 33, the multiphase signal P37 is redundantly generated by the sub interpolation circuits 33 and 34, and the multiphase signal P31 is redundantly generated by the sub interpolation circuits 31 and 34. Any one of each of the redundantly generated multiphase signals may be used.

Figure 8A:
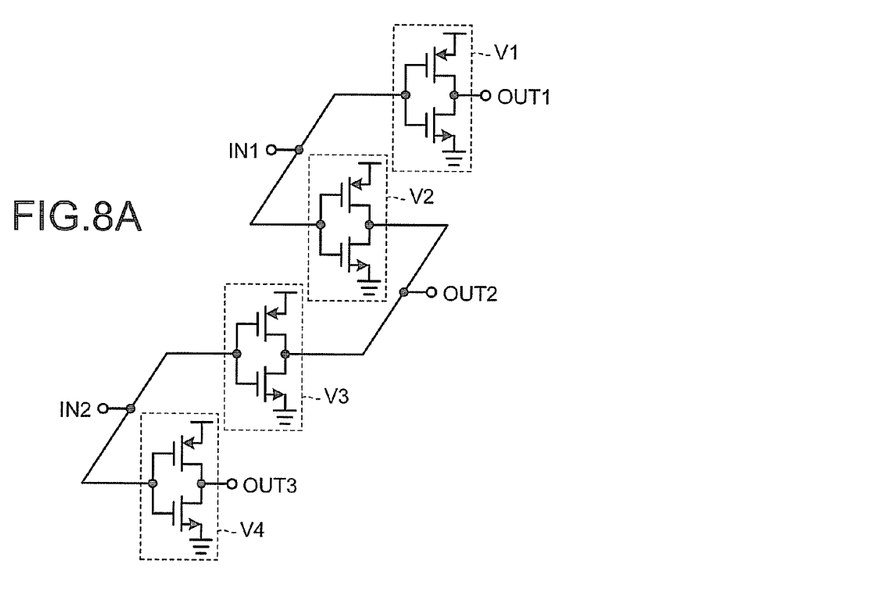
FIG. 8A is a circuit diagram of a schematic configuration of a sub interpolation circuit 31 in FIG. 7A, FIGS. 8B and 8C are views of an input waveform of the sub interpolation circuit 31 in FIG. 8A, and FIGS. 8D to 8F are views of an output waveform of the sub interpolation circuit 31 in FIG. 8A.
Figure 8B:
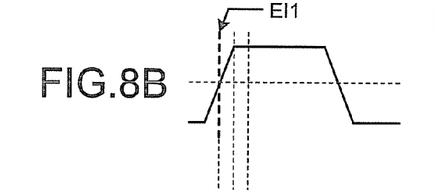
Figure 8C:
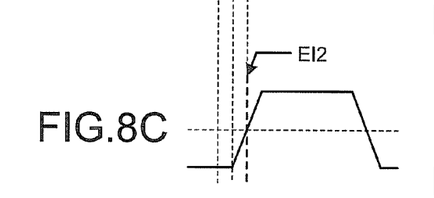

FIG. 8A is a circuit diagram of a schematic configuration of the sub interpolation circuit 31 in FIG. 7A, FIGS. 8B and 8C are views of an input waveform of the sub interpolation circuit 31 in FIG. 8A, and FIGS. 8D to 8F are views of an output waveform of the sub interpolation circuit 31 in FIG. 8A. Meanwhile, the interpolation circuits 32 to 34 may also be configured as the sub interpolation circuit 31.

In FIG. 8A, the sub interpolation circuit 31 is provided with inverters V1 to V4. Herein, input terminals of the inverters V1 and V2 are connected to each other and an input terminal IN1 of the sub interpolation circuit 31 is provided on a connecting point thereof. Input terminals of the inverters V3 and V4 are connected to each other and an input terminal IN2 of the sub interpolation circuit 31 is provided on a connecting point thereof.

An output terminal OUT1 of the sub interpolation circuit 31 is provided on an output terminal of the inverter V1. An output terminal OUT3 of the sub interpolation circuit 31 is provided on an output terminal of the inverter V4. Output terminals of the inverters V2 and V3 are connected to each other and an output terminal OUT2 of the sub interpolation circuit 31 is provided on a connecting point thereof.

Figure 8D:
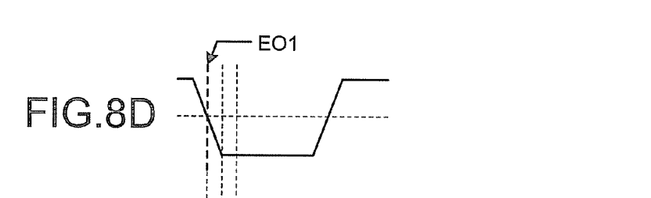
Figure 8E:
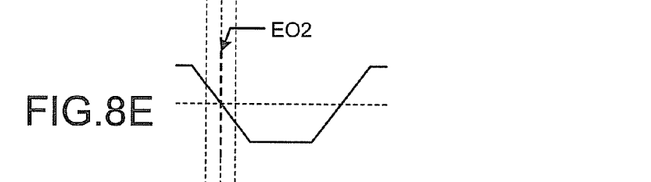
Figure 8F:
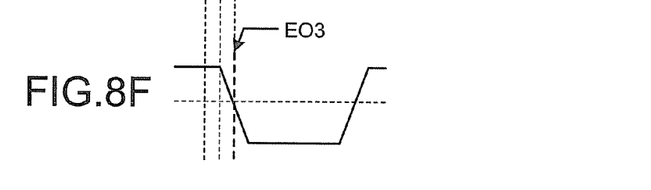

Then, suppose that the waveform in FIG. 8B is input to the input terminal IN1 as the multiphase signal P21 and the waveform in FIG. 8C is input to the input terminal IN2 as the multiphase signal P22. In this case, a waveform having a trailing edge EO1 corresponding to a rising edge EI1 of the waveform in FIG. 8B as illustrated in FIG. 8D is output from the output terminal OUT1. A waveform having a trailing edge EO3 corresponding to a rising edge EI2 of the waveform in FIG. 8C as illustrated in FIG. 8F is output from the output terminal OUT3.

On the other hand, a waveform obtained by synthesizing outputs of the inverters V2 and V3 is output from the output terminal OUT2. Herein, the waveform in FIG. 8B is input to the inverter V2 and the waveform in FIG. 8C is input to the inverter V3. Therefore, the waveform obtained by synthesizing the outputs of the inverters V2 and V3 becomes the waveform obtained by averaging the waveform in FIG. 8D and the waveform in FIG. 8F as illustrated in FIG. 8E, and a trailing edge EO2 of the waveform obtained by averaging the waveform in FIG. 8D and the waveform in FIG. 8F lies between the trailing edges EO1 and EO3. At that time, when characteristics of a P-channel field effect transistor and an N-channel field effect transistor composing the inverters V1 to V4 are ideally symmetrical, the trailing edge EO2 lies midway between the trailing edges EO1 and EO3.

The trailing edge EO2 is generated based on the trailing edges EO1 and EO3. Therefore, when the trailing edges EO1 and EO3 are normalized by the cycles of the differential oscillation signals P11 and P12, the trailing edge EO2 also is normalized by the cycles of the differential oscillation signals P11 and P12, so that the normalization process to calculate time of the trailing edge EO2 based on the cycles of the differential oscillation signals P11 and P12 becomes not necessary.

Figure 9A:
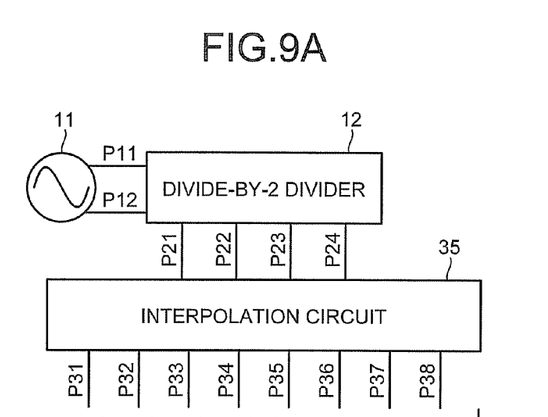
FIG. 9A is a block diagram of the schematic configuration of the multiphase circuit in FIG. 6.
Figure 9B:
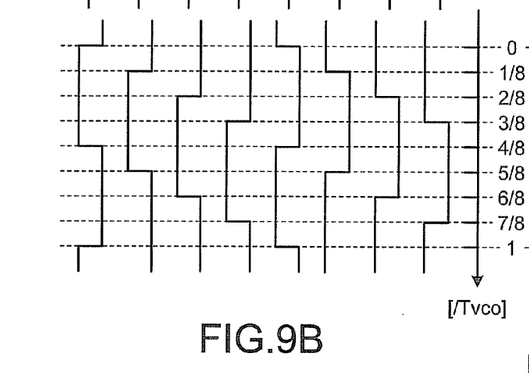
FIG. 9B is a timing chart of an output waveform of the multiphase circuit in FIG. 9A.
Figure 9C:
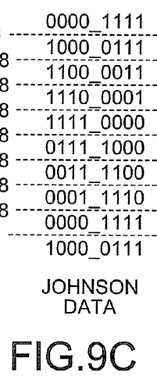
FIG. 9C is a view in which the output waveform in FIG. 9B is represented as Johnson data.
Figure 9D:
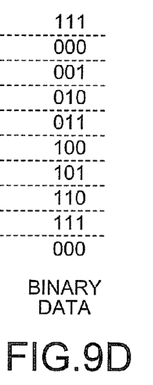
FIG. 9D is a view in which the output waveform in FIG. 9B is represented as binary data.

FIG. 9A is a block diagram of a schematic configuration of the multiphase circuit in FIG. 6, FIG. 9B is a timing chart of an output waveform of the multiphase circuit in FIG. 9A, FIG. 9C is a view in which the output waveform in FIG. 9B is represented as the Johnson data, and FIG. 9D is a view in which the output waveform in FIG. 9B is represented as the binary data.

In FIG. 9, the multiphase signals P31 to P38 of which phases are different from one another by 45 degrees are output from the interpolation circuit 35.

Herein, in a case in which the differential oscillator 11 is used in place of the differential oscillator 1 in FIG. 1 and the divide-by-2 divider 12 and the interpolation circuit 35 are used as the multiphase circuit 2 in FIG. 1, when the rising edge of the reference signal RCK lies between −1/8 [/Tvco] and 0 [/Tvco], the Johnson data "00001111" is output to the decoder 3 as the output signals Q1 to Q8 to be converted to the binary data "111".

When the rising edge of the reference signal RCK lies between 0 [/Tvco] and 1/8 [/Tvco], the Johnson data "10000111" is output to the decoder 3 as the output signals Q1 to Q8 to be converted to the binary data "000".

When the rising edge of the reference signal RCK lies between 1/8 [/Tvco] and 2/8 [/Tvco], the Johnson data "11000011" is output to the decoder 3 as the output signals Q1 to Q8 to be converted to the binary data "001".

When the rising edge of the reference signal RCK lies between 2/8 [/Tvco] and 3/8 [/Tvco], the Johnson data "11100001" is output to the decoder 3 as the output signals Q1 to Q8 to be converted to the binary data "010".

When the rising edge of the reference signal RCK lies between 3/8 [/Tvco] and 4/8 [/Tvco], the Johnson data "11110000" is output to the decoder 3 as the output signals Q1 to Q8 to be converted to the binary data "011".

When the rising edge of the reference signal RCK lies between 4/8 [/Tvco] and 5/8 [/Tvco], the Johnson data "01111000" is output to the decoder 3 as the output signals Q1 to Q8 to be converted to the binary data "100".

When the rising edge of the reference signal RCK lies between 5/8 [/Tvco] and 6/8 [/Tvco], the Johnson data "00111100" is output to the decoder 3 as the output signals Q1 to Q8 to be converted to the binary data "101".

When the rising edge of the reference signal RCK lies between 6/8 [/Tvco] and 7/8 [/Tvco], the Johnson data "00011110" is output to the decoder 3 as the output signals Q1 to Q8 to be converted to the binary data "110".

When the rising edge of the reference signal RCK lies between 7/8 [/Tvco] and 1 [/Tvco], the Johnson data "00001111" is output to the decoder 3 as the output signals Q1 to Q8 to be converted to the binary data "111".

When the rising edge of the reference signal RCK lies between 1 [/Tvco] and 9/8 [/Tvco], the Johnson data "10000111" is output to the decoder 3 as the output signals Q1 to Q8 to be converted to the binary data "000".

(Fifth Embodiment)

Figure 10:
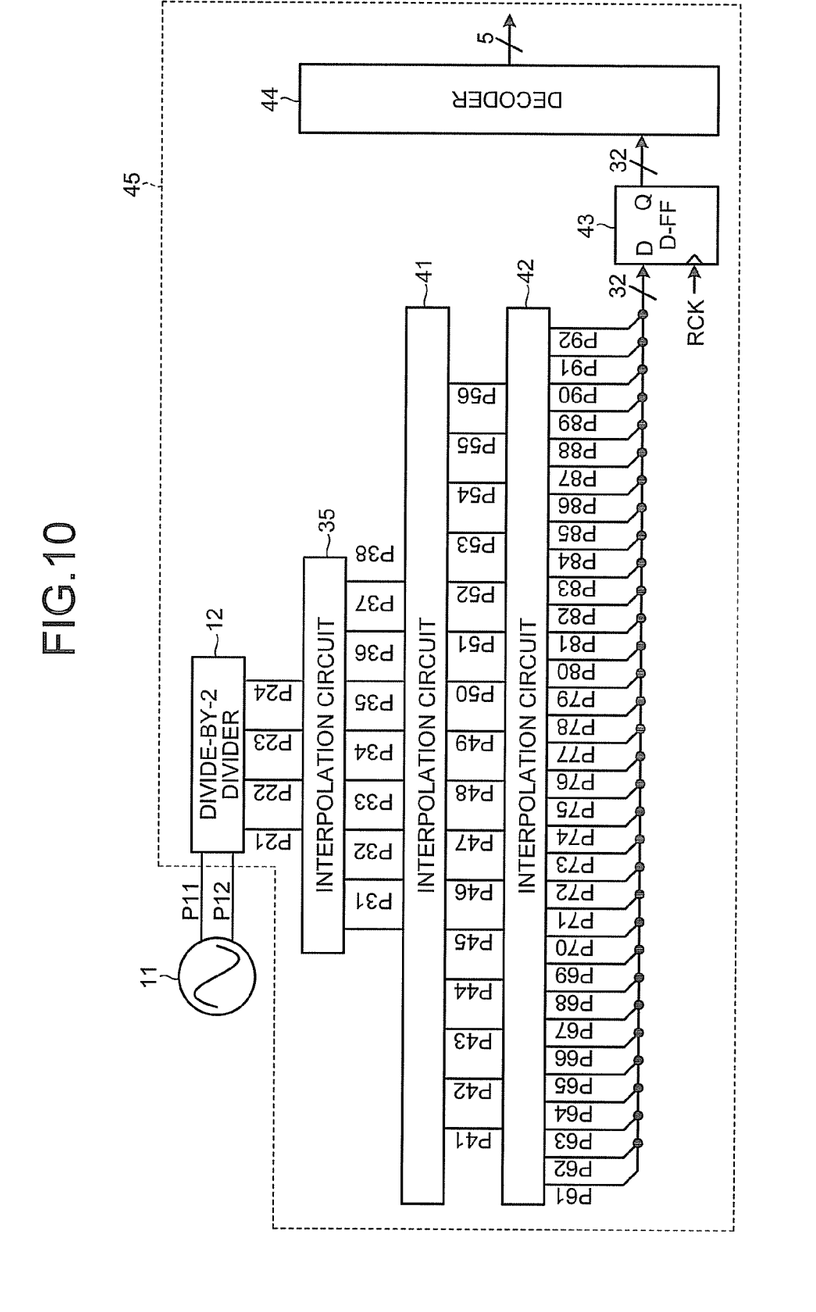
FIG. 10 is a block diagram of a schematic configuration of the time to digital converter according to a fifth embodiment.

FIG. 10 is a block diagram of a schematic configuration of the time to digital converter according to a fifth embodiment.

In FIG. 10, a time to digital converter 45 is provided with the divide-by-2 divider 12, interpolation circuits 35, 41 and 42, a flip-flop 43, and a decoder 44.

The interpolation circuit 41 is configured to have 8 inputs and 16 outputs and generates multiphase signals P41 to P56 of which phases are different from one another by 22.5 degrees from the multiphase signals P31 to P38 of which phases are different from one another by 45 degrees.

The interpolation circuit 42 is configured to have 16 inputs and 32 outputs and generates multiphase signals P61 to P92 of which phases are different from one another by 11.25 degrees from the multiphase signals P41 to P56 of which phases are different from one another by 22.5 degrees.

The flip-flop 43 may correspond to the flip-flops F1 to F32 when N is set to 32 in FIG. 1. The decoder 44 may correspond to the decoder 3 in FIG. 1.

In a configuration in FIG. 10, the temporal resolution may be improved 16 times as much as that of the configuration in FIG. 2. In order to further improve the temporal resolution, 2X (X is $2^B$, B is an integral number not smaller than 2)-input-4X-output interpolation circuits may be sequentially connected on a subsequent stage of an X-input-2X-output interpolation circuit.

(Sixth Embodiment)

Figure 11:
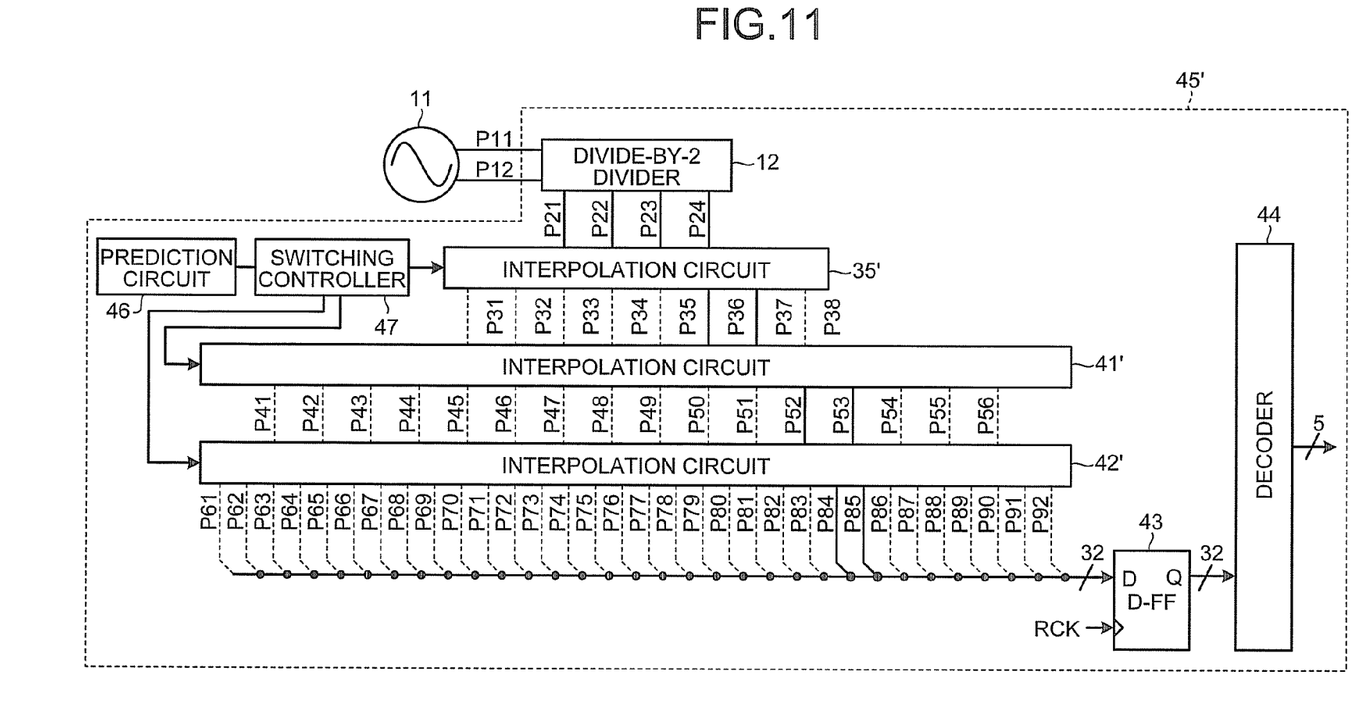
FIG. 11 is a block diagram of an example of a method of operation of the time to digital converter according to a sixth embodiment.

FIG. 11 is a block diagram of an example of a method of operation of the time to digital converter according to a sixth embodiment.

In FIG. 11, a time to digital converter 45' is obtained by adding a prediction circuit 46 and a switching controller 47 to the configuration of the time to digital converter 45 in FIG. 10. Also, the time to digital converter 45' is provided with interpolation circuits 35', 41' and 42' in place of the interpolation circuits 35, 41 and 42 in FIG. 10.

In the interpolation circuits 35', 41' and 42', an inverter with switch is used in place of the inverters V1 to V4 in FIG. 8. The switch may stop the inverter output for each phase of the multiphase signals P31 to P38, P41 to P56 and P61 to P92 output from the interpolation circuits 35', 41' and 42', respectively.

In the prediction circuit 46, the phase of a next reference signal RCK is predicted based on a comparison result of a present reference signal RCK and the multiphase signals P61 to P92. Then, in the switching controller 47, the switch is on/off controlled such that only those to generate the phases before and after the phase of the reference signal RCK predicted by the prediction circuit 46 of the multiphase signals P31 to P38, P41 to P56 and P61 to P92 are generated, and according to this, the output of the inverters, which generate the others of the multiphase signals P31 to P38, P41 to P56 and 261 to 292 is stopped.

For example, when it is predicted that the phase of the next reference signal RCK lies between the rising edges of the multiphase signals 284 and P85 by the prediction circuit 46, only the inverters, which generate the multiphase signals P35, P36, P52, P53, P84 and P85, are operated, and the inverters, which generate the multiphase signals other than them, are stopped.

According to this, the inverter, which is not required for detecting the phase shift with the next reference signal RCK, may be stopped, thereby realizing low power consumption of the time to digital converter 45'.

(Seventh Embodiment)

Figure 12:
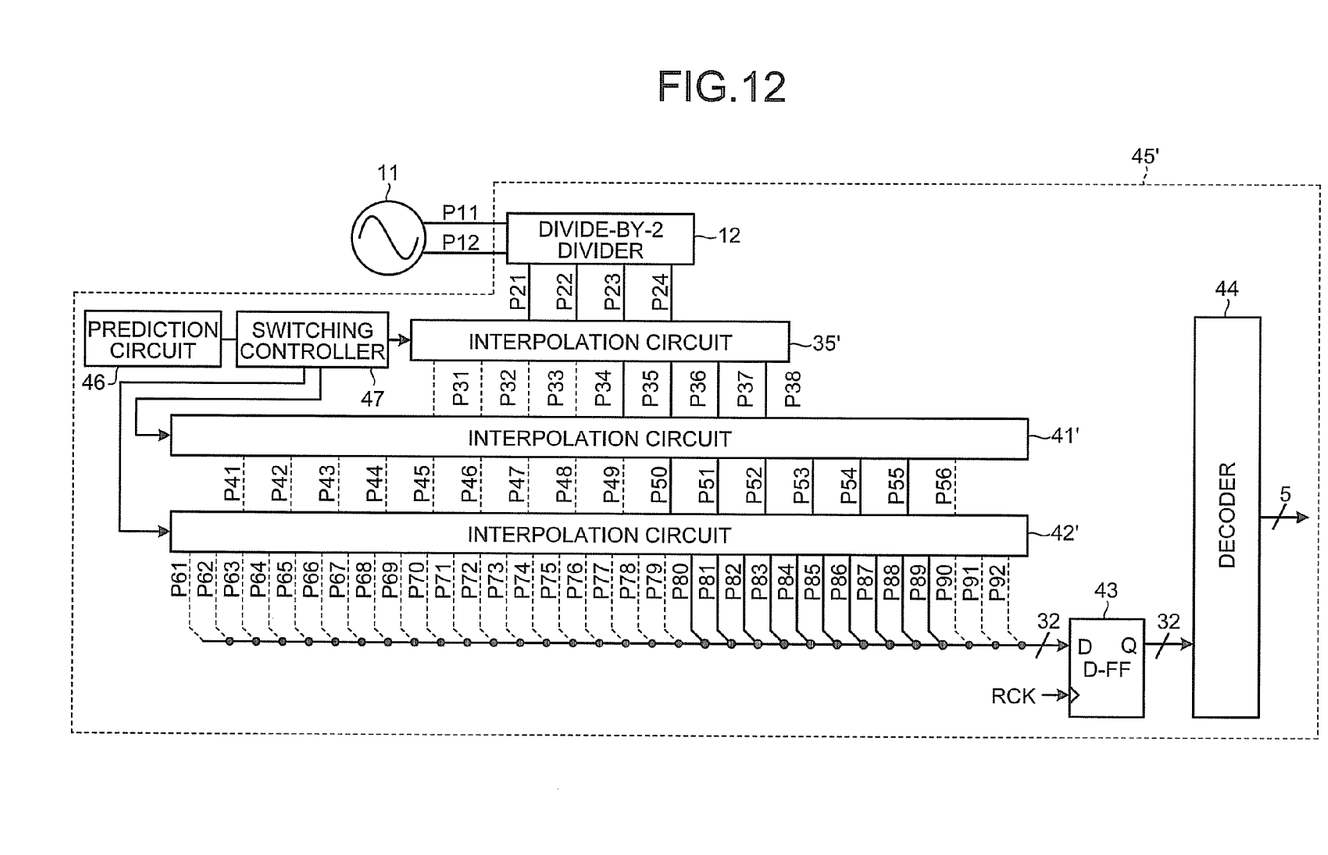
FIG. 12 is a block diagram of an example of the method of operation of the time to digital converter in FIG. 10 according to a seventh embodiment.

FIG. 12 is a block diagram of an example of the method of operation of the time to digital converter in FIG. 10 according to a seventh embodiment.

Although the method of generating only the multiphase signals to generate the phases before and after the phase of the reference signal RCK predicted by the prediction circuit 46 is described in the example in FIG. 11, in FIG. 12, only the multiphase signals to generate the phases in the vicinity of the phase of the reference signal RCK predicted by the prediction circuit 46 may be generated.

For example, when it is predicted by the prediction circuit 46 that the phase of the next reference signal RCK lies between the rising edges of the multiphase signals P84 and P85, it is possible to operate only the inverters, which generate the multiphase signals P35 to P38, P50 to P55 and P80 to P89, and to stop the inverters, which generate the multiphase signals other than them.

According to this, the low power consumption may be realized as compared to a case in which all the inverters are operated, and even in a case in which prediction by the prediction circuit 46 is failed by an effect of noise and the like, generation of the noise may be prevented when an error is within a range to operate the inverter.

(Eighth Embodiment)

Figure 13:
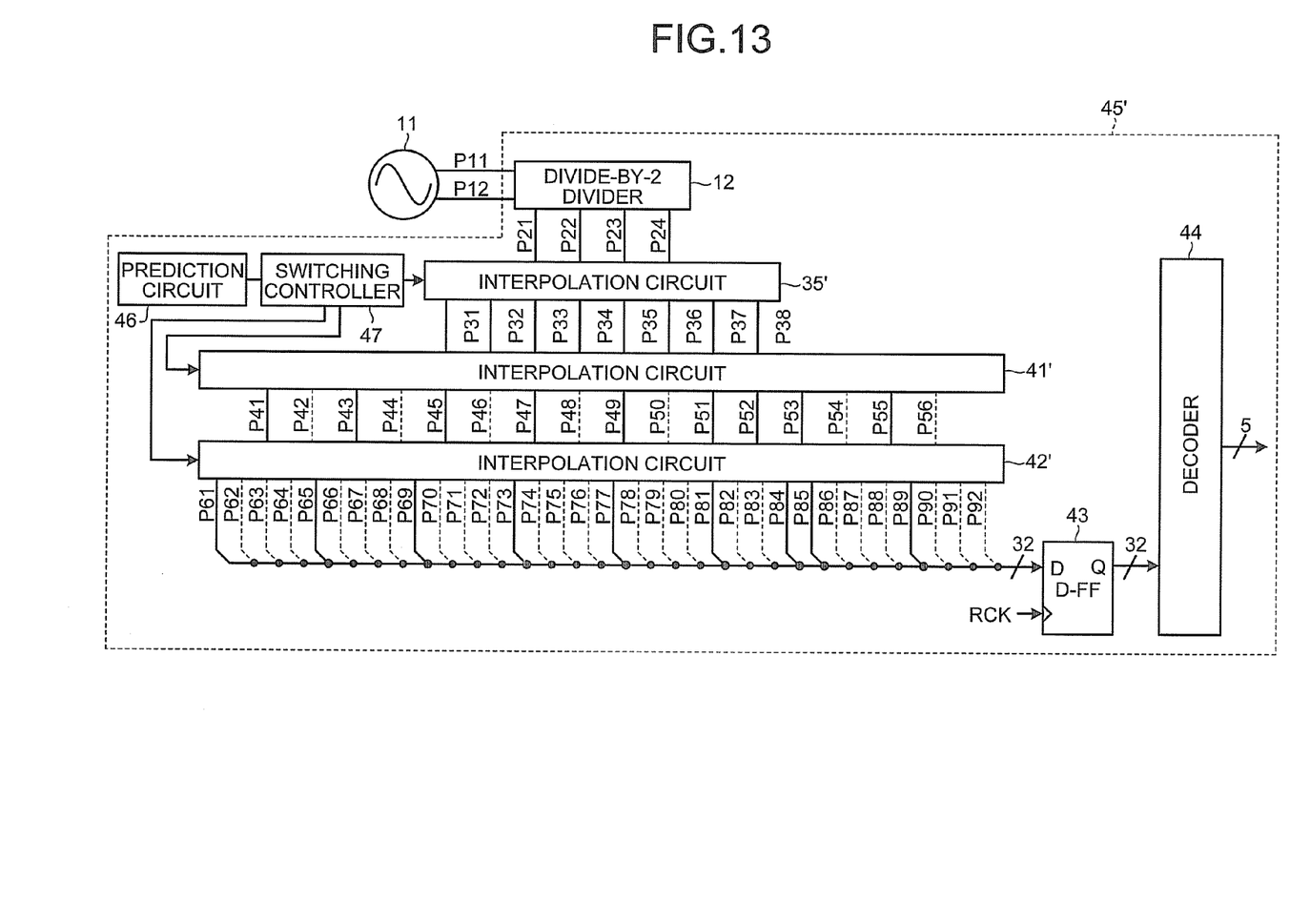
FIG. 13 is a block diagram of an example of the method of operation of the time to digital converter in FIG. 10 according to an eighth embodiment.

FIG. 13 is a block diagram of an example of the method of operation of the time to digital converter in FIG. 10 according to an eighth embodiment.

Although the method of generating only the multiphase signals to generate the phases in the vicinity of the phase of the reference signal RCK predicted by the prediction circuit 46 is described in the example in FIG. 12, in FIG. 13, only the multiphase signals to generate the phases before and after the phase of the reference signal RCK predicted by the prediction circuit 46 and the phase of a higher-bit may be generated.

For example, when it is predicted by the prediction circuit 46 that the phase of the next reference signal RCK lies between the rising edges of the multiphase signals P84 and P85, it is possible to operate only the inverters, which generate the multiphase signals P31 to P38, P41, P43, P45, P47, P49, P51 to P53, P55, P61, P65, P69, P73, P77, P81, P84, P85 and P89, and to stop the inverters, which generate the multiphase signals other than them, thereby securing 3-bit accuracy.

According to this, the low power consumption may be realized as compared to the case in which all the inverters are operated, and even in the case in which the prediction by the prediction circuit 46 is failed by the effect of the noise and the like, higher-bit accuracy may be secured.

Meanwhile, although the method of generating only the multiphase signals to generate the phases before and after the phase of the reference signal RCK predicted by the prediction circuit 46 and the phase of the higher-bit is described in the example in FIG. 13, it is also possible to generate only the multiphase signals to generate the phases in the vicinity of the phase of the reference signal RCK predicted by the prediction circuit 46 and the phase of the higher-bit.

Figure 14:
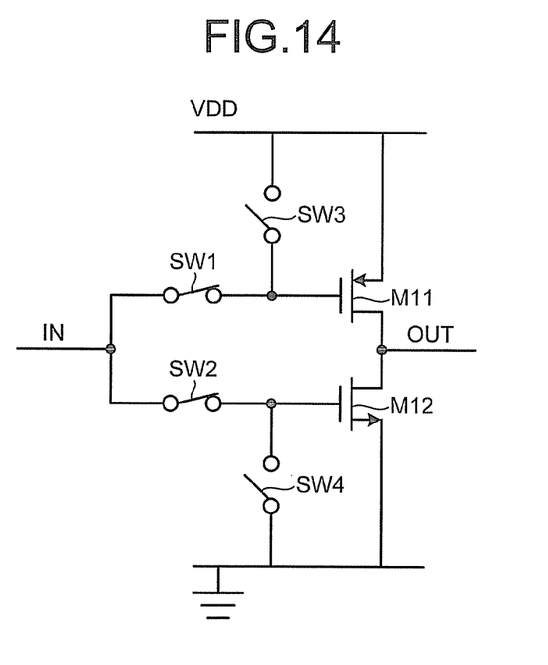
FIG. 14 is a circuit diagram of an example of an inverter circuit with switch applied to the time to digital converter in FIGS. 11 to 13.

FIG. 14 is a circuit diagram of an example of an inverter circuit with switch applied to the time to digital converter in FIGS. 11 to 13.

In FIG. 14, the inverter is provided with field effect transistors M11 and M12. A source of the field effect transistor M11 is connected to the supply potential VDD, a drain of the field effect transistor M11 is connected to a drain of the field effect transistor M12, and the source of the field effect transistor M12 is grounded.

Also, a gate of the field effect transistor M11 is connected to the supply potential VDD through a switch SW3, and a gate of the field effect transistor M12 is grounded through a switch SW4.

Also, a switch SW1 is connected to a connecting point of the gate of the field effect transistor M11 and the switch SW3, and a switch SW2 is connected to a connecting point of the gate of the field effect transistor M12 and the switch SW4.

When an inverter output OUT is made effective relative to the inverter input IN, the switches SW1 and SW2 are turned on and the switches SW3 and SW4 are turned off. When the inverter output OUT is stopped, the switches SW1 and SW2 are turned off and the switches SW3 and SW4 are turned on.

Figure 15:
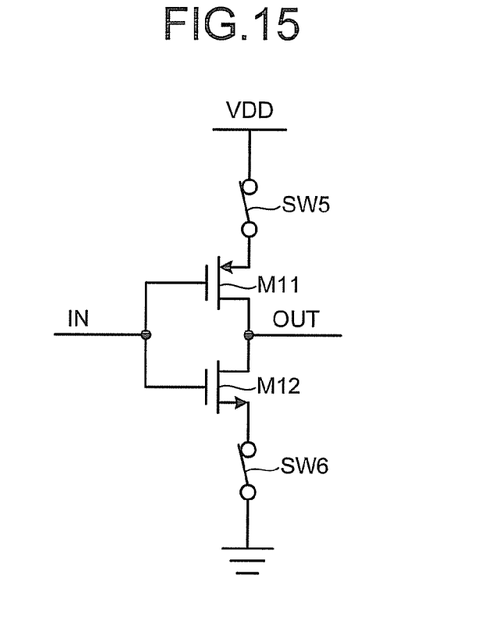
FIG. 15 is a circuit diagram of another example of the inverter circuit with switch applied to the time to digital converter in FIGS. 11 to 13.

FIG. 15 is a circuit diagram of another example of the inverter circuit with switch applied to the time to digital converter in FIGS. 11 to 13.

In FIG. 15, the source of the field effect transistor M11 is connected to the supply potential VDD through a switch SW5 and a source of the field effect transistor M12 is grounded through a switch SW6.

When the inverter output OUT is made effective relative to the inverter input IN, the switches SW5 and SW6 are turned on. When the inverter output OUT is stopped, the switches SW5 and SW6 are turned off.

(Ninth Embodiment)

Figures 16A, 16B, 16C, 16D, 16E:
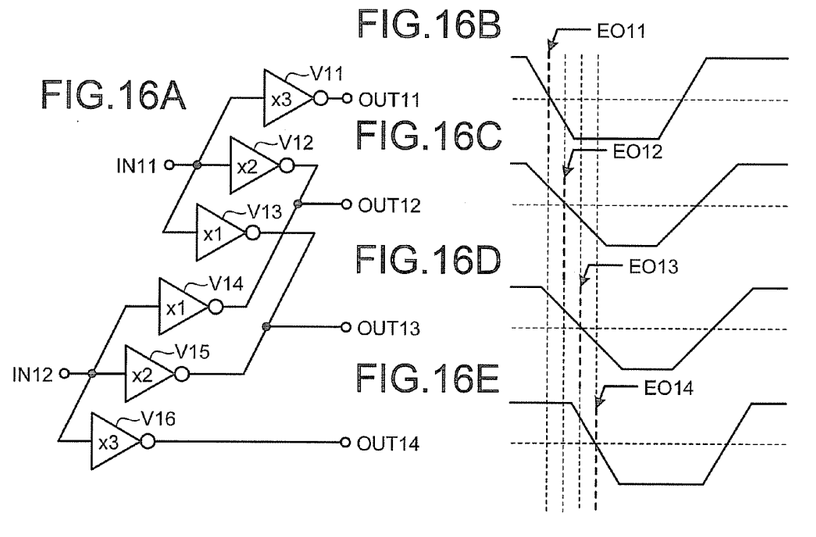
FIG. 16A is a block diagram of a schematic configuration of the interpolation circuit applied to the time to digital converter according to a ninth embodiment.
FIGS. 16B to 16E are views of an output waveform of the interpolation circuit in FIG. 16A.

FIG. 16A is a block diagram of a schematic configuration of the interpolation circuit applied to the time to digital converter according to a ninth embodiment, and FIGS. 16B to 16E are views of an output waveform of the interpolation circuit in FIG. 16A.

In FIG. 16, the interpolation circuit is provided with inverters V11 to V16. Meanwhile, driving force of the inverters V12 and V15 is set twice as much as the driving force of the inverters V13 and V14, and the driving force of the inverters V11 and V16 are set three times as much as the driving force of the inverters V13 and V14.

Herein, input terminals of the inverters V11 to V13 are connected to one another and an input terminal IN11 of the interpolation circuit is provided on a connecting point thereof. Input terminals of the inverters V14 to V16 are connected to one another and an input terminal IN12 of the interpolation circuit is provided on a connecting point thereof.

An output terminal OUT11 of the interpolation circuit is provided on an output terminal of the inverter Vii. An output terminal OUT14 of the interpolation circuit is provided on an output terminal of the inverter V16. Output terminals of the inverters V12 and V14 are connected to each other and an output terminal OUT12 of the interpolation circuit is provided on a connecting point thereof. Output terminals of the inverters V13 and V15 are connected to each other and an output terminal OUT13 of the interpolation circuit is provided on a connecting point thereof.

Then, suppose that the waveform in FIG. 8B is input to the input terminal IN11 and the waveform in FIG. 8C is input to the input terminal IN12. In this case, a waveform having a trailing edge EO11 corresponding to the rising edge EI1 of the waveform in FIG. 8B as illustrated in FIG. 16B is output from the output terminal OUT11. A waveform having a trailing edge EO14 corresponding to the rising edge E12 of the waveform in FIG. 8C as illustrated in FIG. 16E is output from the output terminal OUT14.

On the other hand, a waveform obtained by synthesizing outputs of the inverters V12 and V14 is output from the output terminal OUT12. Herein, the waveform in FIG. 8B is input to the inverter V12 and the waveform in FIG. 8C is input to the inverter V14. The driving force of the inverter V12 is twice as much as the driving force of the inverter V14. Therefore, a waveform obtained by synthesizing the outputs of the inverters V12 and V14 is the waveform obtained by averaging the waveform in FIG. 8D and the waveform in FIG. 8F in a ratio of 2:1 as illustrated in FIG. 16C, and a trailing edge EO12 of the waveform obtained by averaging the waveform in FIG. 8D and the waveform in FIG. 8F in a ratio of 2:1 becomes a first edge of trisection of the interval between the trailing edges EO11 and EO14.

Also, a waveform obtained by synthesizing outputs of the inverters V13 and V15 is output from the output terminal OUT13. Herein, the waveform in FIG. 8B is input to the inverter V13 and the waveform in FIG. 8C is input to the inverter V15. The driving force of the inverter V15 is twice as much as the driving force of the inverter V13. Therefore, the waveform obtained by synthesizing the outputs of the inverters V13 and V15 is the waveform obtained by averaging the waveform in FIG. 8D and the waveform in FIG. 8F in a ratio of 1:2 as illustrated in FIG. 16D, and a trailing edge EO13 of the waveform obtained by averaging the waveform in FIG. 8D and the waveform in FIG. 8F in a ratio of 1:2 becomes a next edge of the trailing edge EO12 of the trisection of the interval between the trailing edges EO11 and EO14.

The trailing edges EO12 and EO13 are generated based on the trailing edges EO11 and EO14. Therefore, when the trailing edges EO11 and EO14 are normalized by the cycles of the differential oscillation signals P11 and P12, the trailing edges EO12 and EO13 also are normalized by the cycles of the differential oscillation signals P11 and P12, so that the normalization process to calculate times of the trailing edges EO12 and EO13 based on the cycles of the differential oscillation signals P11 and P12 becomes not necessary.

Meanwhile, although the method of configuring the 2-input-4-output interpolation circuit using the six inverters V11 to V16 of which driving forces are one time, twice and three times is described in the example in FIG. 16A, by changing combination of the outputs of the inverters with different driving forces, K (K is an integral number not smaller than 3) or more edges may be generated between the phases of the multiphase signals.

For example, in order to form the trailing edge midway between the trailing edges EO12 and EO13, the output may be brought out from the connecting point of the inverters V13 and V14. Also, in order to form the trailing edge midway between the trailing edges EO11 and EO12, the output may be brought out from the connecting point of the inverters V11, V12 and V14. Also, in order to form the trailing edge midway between the trailing edges EO13 and EO14, the output may be brought out from the connecting point of the inverters V13, V15 and V16.

(Tenth Embodiment)

Figure 17:
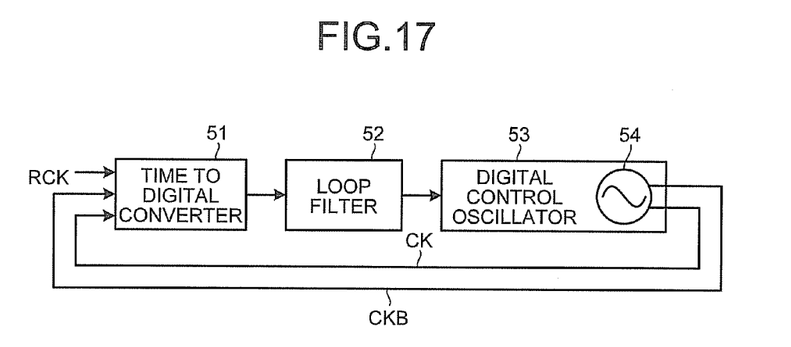
FIG. 17 is a block diagram of a schematic configuration of an all digital phase-locked-loop according to a tenth embodiment.

FIG. 17 is a block diagram of a schematic configuration of an all digital phase-locked-loop according to a tenth embodiment.

In FIG. 17, the all digital phase-locked-loop is provided with a time to digital converter 51, a loop filter 52, and a digital control oscillator 53, and the digital control oscillator 53 is provided with a differential oscillator 54.

Meanwhile, the configurations of the time to digital converters 4, 45 and 45' may be used as the time to digital converter 51, for example. The differential oscillator 54 may be used as the differential oscillators 1 and 11, for example.

Then, phase shift between differential oscillation signals CK and CKB of the differential oscillator 54 and the reference signal RCK is detected by the time to digital converter 51, and a detection result is input to the digital control oscillator 53 through the loop filter 52. An oscillation frequency of the differential oscillator 54 is controlled by the digital control oscillator 53 such that the phase shift between the differential oscillation signals CK and CKB of the differential oscillator 54 and the reference signal RCK becomes smaller.

For example, when the configuration in FIG. 9 is used as the multiphase circuit 2 of the differential oscillator 54 and the time to digital converter 51, when the rising edge of the reference signal RCK lies between 2/8 [/Tvco] and 3/8 [/Tvco], the binary data "010" is output from the time to digital converter 51. Then, the digital control oscillator 53 controls the oscillation frequency of the differential oscillator 54 based on the binary data "010", and according to this, the phase shift between the differential oscillation signals CK and CKB of the differential oscillator 54 and the reference signal RCK is made smaller.

Meanwhile, the digital phase-locked-loop may be used to generate a local oscillation signal of a wireless communication LSI, for example. When a frequency of the reference signal RCK is 40 MHz, if the oscillation frequency of the differential oscillation signals CK and CKB is controlled to 2.42 GHZ, it is controlled such that there are 60.5 cycles of the differential oscillation signals CK and CKB on an average in the cycle of the reference signal RCK.

That is to say, difference between the phase of each 60.5 cycles of the differential oscillation signals CK and CKB and the phase of 1 cycle of the reference signal RCK is detected by the time to digital converter 51. Then, the oscillation frequency of the differential oscillation signals CK and CKB is controlled by the digital control oscillator 53 such that the difference between the phases becomes 0.

Herein, when using the all digital phase-locked-loop for generating the local oscillation signal of mWiMAX, for example, phase noise within a PLL loop band is required to be −100 dBc/Hz or lower. When the frequency of the reference signal RCK is 40 MHz, in order to satisfy the requirement for the phase noise, the temporal resolution not longer than 0.03 [/Tvco] (not longer than 12 psec in delay time) is required.

The temporal resolution not longer than 0.03 [/Tvco] is shorter than the delay time of the inverter fabricated by a manufacturing process of a generation used in a current wireless communication LSI, so that this is not realized by the time to digital converter to calculate the phase shift between the output signal of the oscillator and the reference signal by using the delay time of the delay element as a unit.

On the other hand, when using the time to digital converter 45 in FIG. 10 as the time to digital converter 51, for example, the temporal resolution not longer than 0.03 [/Tvco] may be realized and the all digital phase-locked-loop, which satisfies a specification of the mWiMAX, may be fabricated.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A time to digital converter, comprising:
   a multiphase circuit that generates multiphase signals of which phases are different from each other by 180/M degrees by dividing a differential oscillation signal by M (M is an integral number not smaller than 2);
   a flip-flop that captures the multiphase signals in synchronization with an input of a reference signal; and
   a decoder that decodes an output signal of the flip-flop, wherein
   the multiphase circuit comprises a divide-by-2 circuit that generates the multiphase signals of which phases are different from each other by 90 degrees by dividing the differential oscillation signal by 2, and
   an interpolation circuit that interpolates an interval between the phases of the multiphase signals at regular intervals by synthesizing a plurality of inverter outputs driven by the multiphase signals of which phases are different from each other.

2. The time to digital converter according to claim 1, wherein
   the interpolation circuit interpolates such that K (K is an integral number not smaller than 3) or more edges are generated between the phases of the multiphase signals by changing combination of the outputs of the inverters of which driving forces are different from each other.

3. The time to digital converter according to claim 1, wherein
   the interpolation circuit generates $2^{M+1}$ multiphase signals of which phases are different from one another by $180/2^{M+1}$ degrees by interpolating $2^M$ multiphase signals of which phases are different from one another by $180/2^M$ degrees.

4. The time to digital converter according to claim 3, wherein
   K (K is a positive integral number) stage of the interpolation circuit is connected, thereby generating $2^{K+2}$ multiphase signals of which phases are different from one another by $180/2^{K+2}$ degrees from four multiphase signals of which phases are different from one another by 90 degrees.

5. The time to digital converter according to claim 4, wherein
   a 4-input-8-output interpolation circuit is obtained by combining four 2-input-3-output sub interpolation circuits that generate three multiphase signals of which phases are different from one another by 45 degrees from two multiphase signals of which phases are different from each other by 90 degrees.

6. The time to digital converter according to claim 5, wherein
   the sub interpolation circuit comprises
   a first inverter that generates a first multiphase output signal by inverting a first multiphase input signal,
   second and third inverters that generate a second multiphase output signal of which phase is different from the phase of the first multiphase output signal by 45 degrees by synthesizing signals obtained by inverting the first multiphase input signal and a second multiphase input signal of which phase is different from the phase of the first multiphase input signal by 90 degrees, and
   a fourth inverter that generates a third multiphase output signal of which phase is different from the phase of the first multiphase output signal by 90 degrees by inverting the second multiphase input signal.

7. The time to digital converter according to claim 1, comprising:
   a switch that stops the inverter output for each phase of the multiphase signals obtained by the interpolation;

a prediction circuit that predicts a phase of a next reference signal based on a comparison result between a present reference signal and the multiphase signals; and a switching controller that on/off controls the switch based on a prediction result by the prediction circuit.

8. The time to digital converter according to claim 7, wherein
the switching controller on/off controls the switch such that only the multiphase signals that generate phases before and after the phase of the reference signal predicted by the prediction circuit are generated.

9. The time to digital converter according to claim 7, wherein
the switching controller on/off controls the switch such that only the multiphase signals that generate phases in the vicinity of the phase of the reference signal predicted by the prediction circuit are generated.

10. The time to digital converter according to claim 7, wherein
the switching controller on/off controls the switch such that only the multiphase signals that generate phases before and after the phase of the reference signal predicted by the prediction circuit and a phase of a higher-bit are generated.

11. The time to digital converter according to claim 7, wherein
the switching controller on/off controls the switch such that only the multiphase signals that generate phases in the vicinity of the phase of the reference signal predicted by the prediction circuit and a phase of a higher-bit are generated.

12. The time to digital converter according to claim 7, wherein
the inverter comprises a P-channel field effect transistor and an N-channel field effect transistor, and
the switch comprises
a first switch connected between a gate of the P-channel field effect transistor and an input point of the multiphase signals,
a second switch connected between a gate of the N-channel field effect transistor and the input point of the multiphase signals,
a third switch connected between the gate and a source of the P-channel field effect transistor, and
a fourth switch connected between the gate and a source of the N-channel field effect transistor.

13. The time to digital converter according to claim 7, wherein
the inverter comprises a P-channel field effect transistor and an N-channel field effect transistor, and
the switch comprises
a first switch connected between a source of the P-channel field effect transistor and supply potential, and
a second switch connected between a source of the N-channel field effect transistor and ground potential.

14. An all digital phase-locked-loop, comprising:
a time to digital converter that detects phase shift between a differential oscillation signal and a reference signal based on a multiphase signal generated based on a cycle of the differential oscillation signal; and
a digital control oscillator provided with a differential oscillator to generate the differential oscillation signal that controls an oscillation frequency of the differential oscillation signal based on a detection result by the time to digital converter, wherein
the time to digital converter comprises
a multiphase circuit that generates multiphase signals of which phases are different from each other by 180/M degrees by dividing the differential oscillation signal by M (M is an integral number not smaller than 2);
a flip-flop that captures the multiphase signals in synchronization with an input of a reference signal; and
a decoder that decodes an output signal of the flip-flop, wherein
the multiphase circuit comprises
a divide-by-2 circuit that generates the multiphase signals of which phases are different from each other by 90 degrees by dividing the differential oscillation signal by 2, and
an interpolation circuit that interpolates an interval between the phases of the multiphase signals at regular intervals by synthesizing a plurality of inverter outputs driven by the multiphase signals of which phases are different from each other.

15. The all digital phase-locked-loop according to claim 14, wherein
the interpolation circuit interpolates such that K (K is an integral number not smaller than 3) or more edges are generated between the phases of the multiphase signals by changing combination of the outputs of the inverters having different driving forces.

16. The all digital phase-locked-loop according to claim 14, wherein
the interpolation circuit generates $2^{M+1}$ multiphase signals of which phases are different from one another by $180/2^{M+1}$ degrees by interpolating $2^M$ multiphase signals of which phases are different from one another by $180/2^M$ degrees.

17. The all digital phase-locked-loop according to claim 16, wherein
K (K is a positive integral number) stage of the interpolation circuit is connected, thereby generating $2^{K+2}$ multiphase signals of which phases are different from each other by $180/2^{K+2}$ degrees from four multiphase signals of which phases are different from each other by 90 degrees.

* * * * *